United States Patent [19]
Okubo et al.

[11] Patent Number: 6,118,799
[45] Date of Patent: Sep. 12, 2000

[54] SEMICONDUCTOR LASER DEVICE

[75] Inventors: Atsushi Okubo; Yoshikazu Yamada; Tsuyoshi Fujimoto; Satoru Okada; Yumi Naito; Kiyofumi Muro, all of Sodegaura, Japan

[73] Assignee: Mitsui Chemicals, Inc., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/817,602
[22] PCT Filed: Oct. 16, 1995
[86] PCT No.: PCT/JP95/02118
§ 371 Date: Jun. 10, 1997
§ 102(e) Date: Jun. 10, 1997
[87] PCT Pub. No.: WO96/12328
PCT Pub. Date: Apr. 25, 1996

[30] Foreign Application Priority Data

Oct. 18, 1994 [JP] Japan ................ 6-252431
Dec. 28, 1994 [JP] Japan ................ 6-328766

[51] Int. Cl.[7] .................................................. H01S 3/085
[52] U.S. Cl. .................................... 372/46; 372/45
[58] Field of Search ............................ 372/45, 46

[56] References Cited

U.S. PATENT DOCUMENTS

| | | | |
|---|---|---|---|
| 4,329,660 | 5/1982 | Yano et al. | 372/46 |
| 4,635,268 | 1/1987 | Motegi et al. | 372/45 |
| 4,823,352 | 4/1989 | Sugimoto | 372/45 |
| 4,982,409 | 1/1991 | Kinoshita et al. | 372/46 |
| 5,301,202 | 4/1994 | Harder et al. | 372/46 |
| 5,331,655 | 7/1994 | Harder et al. | 372/45 |
| 5,369,658 | 11/1994 | Ikawa et al. | 372/45 |
| 5,467,364 | 11/1995 | Muro et al. | 372/45 |

FOREIGN PATENT DOCUMENTS

| | | |
|---|---|---|
| 0575684A1 | 12/1993 | European Pat. Off. . |
| 0578836A1 | 1/1994 | European Pat. Off. . |
| 60-245189 | 12/1985 | Japan . |
| 62-32678 | 2/1987 | Japan . |
| 1175284 | 7/1989 | Japan . |
| 3276785 | 12/1991 | Japan . |
| 4180684 | 6/1992 | Japan . |
| 563293 | 3/1993 | Japan . |
| 5505542 | 5/1993 | Japan . |
| 5283790 | 10/1993 | Japan . |
| 6-97572 | 4/1994 | Japan ............ 372/45 |
| 636456 | 5/1994 | Japan . |
| 6181362 | 6/1994 | Japan . |

OTHER PUBLICATIONS

IEEE Journal of Quantum Electronics vol. 29, No. 6, pp. 1889–1894 (1993). (Jun.).

*Primary Examiner*—James W. Davie

[57] ABSTRACT

A semiconductor device including a buffer layer 32 on n-GaAs, a clad layer 31, a wave guide layer 30 and a carrier block layer 29 of n-AlGaAs, a side barrier layer 28 of non-doped AlGaAs, an active layer 27 which is formed by two non-doped GaAs quantum well layers and a barrier layer of AlGaAs, a side barrier layer 26 of non-doped AlGaAs, a carrier block layer 25, a wave guide layer 23 and a clad layer 22 of p-AlGaAs, and a cap layer 21 of p-GaAs are grown in this order. Inside the wave guide layer 23, current blocking layers 24 having a lower refractive index and higher Al-composition than that of the wave guide layer and sandwich a strip-shaped active region 34. This creates a refractive index difference between the active region 34 and buried regions 33 in which each of the current blocking layers 24 exists, thereby forming a refractive index guide structure. Thus, it is possible to obtain a high-output semiconductor laser device of the refractive index guided type which is easy to manufacture.

41 Claims, 9 Drawing Sheets

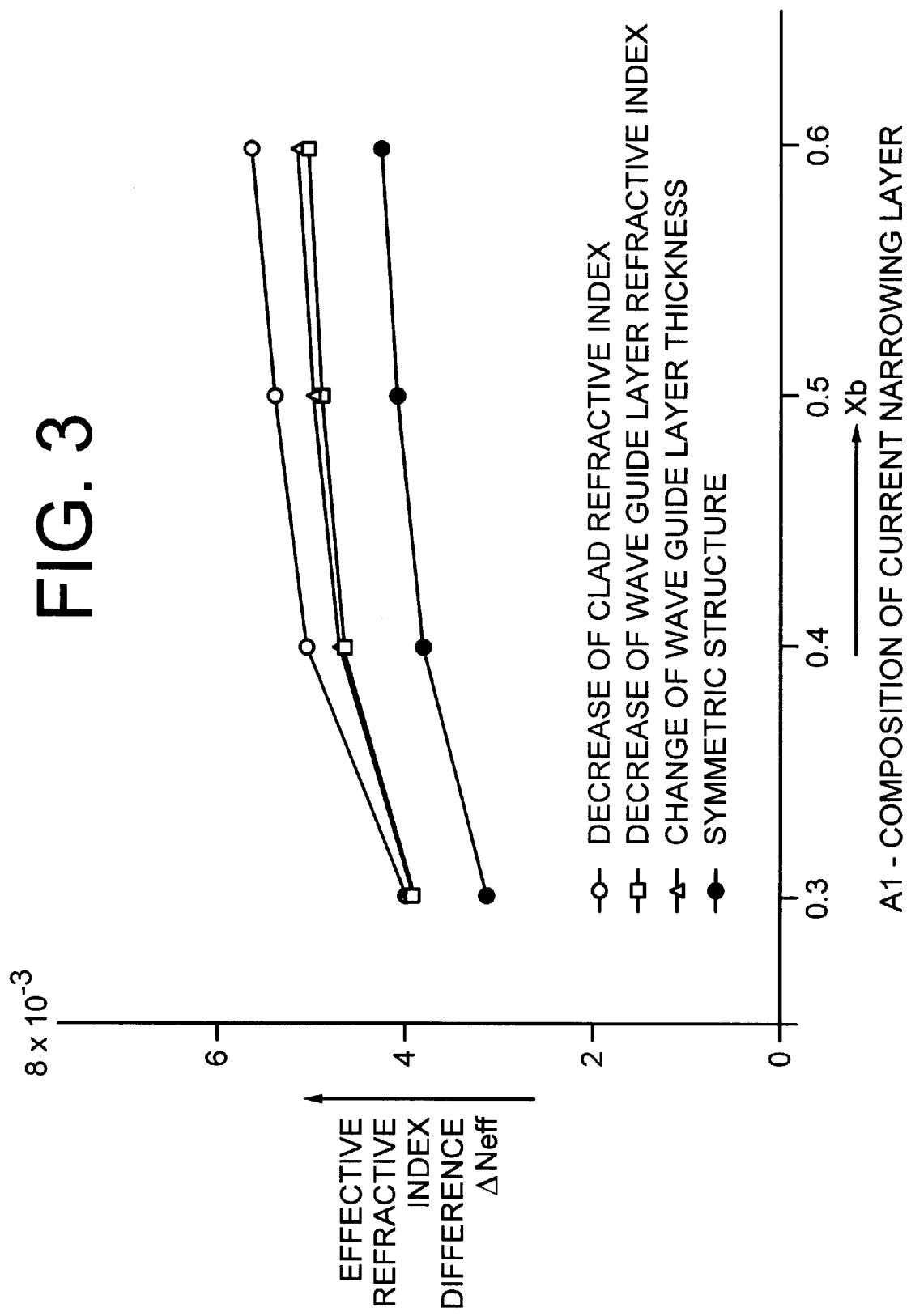

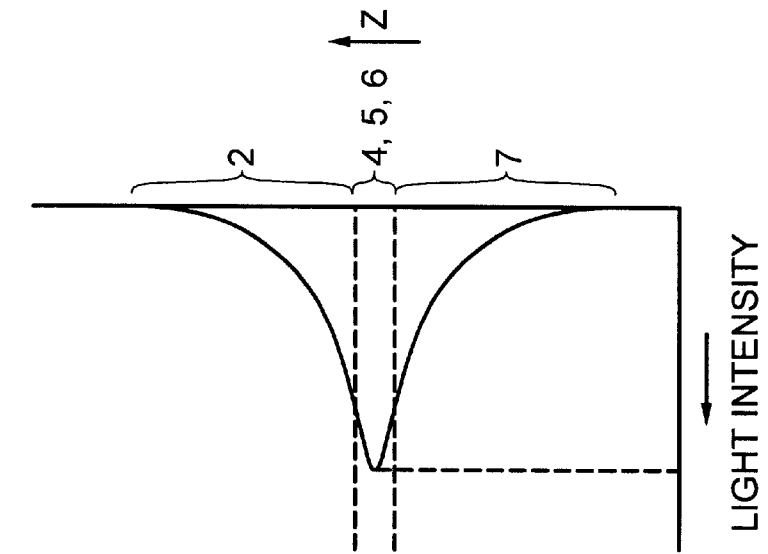
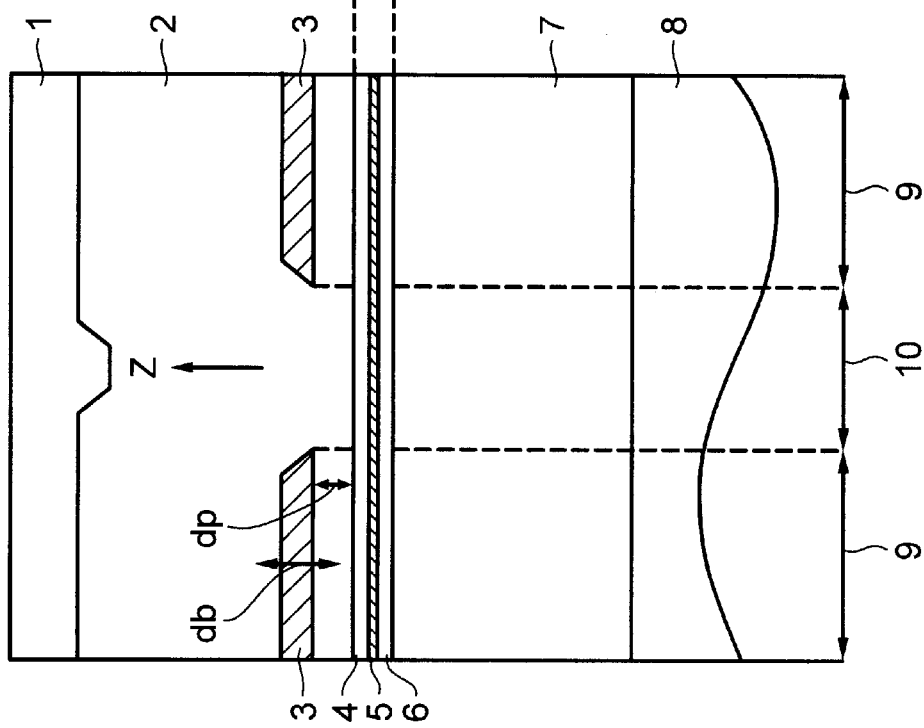
FIG. 8(a) PRIOR ART
FIG. 8(b) PRIOR ART

FAR-FIELD PATTERN

CHARACTERISTIC OF CURRENT TO OPTICAL OUTPUT

SEMICONDUCTOR LASER DEVICE

FIELD OF THE INVENTION

The present invention relates to a high-output semiconductor laser device which is used for communication, optical recording on an optical disk or the like, a laser printer, laser medical care, laser processing and the like, and more particularly, which is suitable to excitation of a solid-state laser and a harmonic conversion element which require a high power laser beam.

BACKGROUND OF THE INVENTION

With respect to an optical wave guide mechanism, semiconductor laser devices are classified into the gain guided type and the refractive index guided type. The former gain guided type is met with various application inconveniences since this type is unstable as to a transverse mode and astigmatism is large which indicates displacements of beam waists (i.e., a position at which the beam width is minimum) in directions parallel and perpendicular to the junction. On the other hand, the latter refractive index guided type is advantageous due to stability as to transverse mode and small astigmatism.

An example of a semiconductor laser of the refractive index guided type in a BH (Buried Heteroastructure) laser. A BH laser, with an active layer buried in a material having a low refractive index, is advantageous in that the BH laser is completely of the refractive index guided type, has a small threshold current Ith, oscillates in a basic transverse mode, and has small astigmatism. On the other hand, a BH laser is not suitable as a high-output laser, since damage or impurities introduced into the active layer during processing of the active layer functions as a non-emission recombination center.

Furthermore, as a laser of a type which creates a refractive index difference in the vicinity of an active layer, creates a refractive index distribution and confines a transverse mode, there are a CSP (Channeled Substrate Planar) laser and a VSIS laser. Since in the vicinity of an active layer in such a laser, current blocking layers having a large absorption coefficient of laser light are formed so that it is possible to control a relatively small refractive index difference, thus obtaining basic mods oscillations even with a large stripe width. However, this absorption serves as an internal loss, and therefore, the threshold current Ith becomes large and a differential efficiency becomes small.

To solve the problems above described, a semiconductor laser of the refractive index guided type with a small loss which uses a current blocking layer which is not absorbent and have a low refractive index has been proposed (IEEE Journal of Quantum Electronics, Vo.29, No.6, p.1889–1894. (1993)).

FIG. 8(a) is a structure view showing an example of the semiconductor laser of the refractive index guided type with a small loss and uses a non-absorbent current blocking layer mentioned above, while FIG. 8(b) is a graph showing a guided mode of the semiconductor laser. In FIG. 8(a), on a buffer layer 8 of GaAs, a clad layer 7 of AlGaAs, a wave guide layer 6 of AlGaAs, an active layer 5 of GaAs, a wave guide layer 4 of AlGAs, a clad layer 2 of AlGaAs, and a cap layer 1 of GaAs are formed in this order, and current blocking layers 3 which have higher Al-composition and a lower refractive index than that of the clad layer is formed in the clad layer to sandwich a stripe-shaped active region 10. This creates a refractive index difference between the active region 10 and buried regions 9 in which the current blocking layers 3 are formed, whereby a refractive index guide structure is obtained.

This structure is based on an SCH (Separate Confinement Heterostructure) structure which is generally used as a high-output semiconductor laser, where by burying the current blocking layers 3 having higher Al-composition and a lower refractive index than that of the clad layer in the vicinity of the active layer 5 to create a refractive index distribution in a transverse direction, the buried current blocking layers 3 do not absorb laser light to make an internal loss small and a basic transverse mode oscillations are realized up to high optical outputs.

However, it is known that the semiconductor laser of the refractive index guided type shown in FIGS. 8(a) and 8(b) has a very small production margin and a low production yield. In other words, to ensure stable laser oscillations up to relatively high optical outputs, an effective refractive index difference $\Delta$Neff between an action region and burled regions which are requirements in a refractive index guide structure has been discussed in various types of literature. For instance, $\Delta$Neff$\geq$5$\times$10$^{-3}$ in the reference mentioned above, while $\Delta$Neff$\geq$4$\times$10$^{-3}$ in other reference (i.e., Japanese Patent Examined Publication (koukoku) No. 6-36456 (1994)). Thus, in order to ensure a refractive index difference of a certain value or more, it is necessary to form current blocking layers having a sufficiently low refractive index sufficiently close to an active layer.

Still, it is very difficult to control an effective refractive index using current blocking layers of a low refractive index in the conventional SCH structure. A first reason is that if a wave guide path is too asymmetric due to forming current blocking layers, a normalized frequency is cut off with respect to a basic mode as well and a guide structure is accordingly destroyed, and hence, an internal loss is increased and a differential efficiency is deteriorated. A second reason is that it is difficult to control a position of the current blocking layers. While current blocking layers are formed by etching in most cases, since it is very difficult to process during etching at an accuracy of 0.1 $\mu$m or lower, there are limits of position and layer thickness in the current blocking layers. A third reason is that if AlGaAs is used for the current blocking layer, for instance, since it is necessary to suppress Al-composition as low as possible in the current blocking layer, in order to prevent oxidation in the vicinity of the current blocking layers and deterioration in crystallization during the processing, it is difficult to create a sufficient refractive index difference (Al-composition difference) between a clad layer and current blocking layers in the conventional structure.

After all, under a few restrictions regarding a current blocking layer, it is very difficult to form a refractive index guide structure using current blocking layers having a low refractive index in the conventional SCH structure, and a production margin is small.

DISCLOSURE OF THE INVENTION

An object of the present invention is to provide a semiconductor laser device of a refractive index guided type which has a high output and is easy to manufacture.

The present invention provides a semiconductor laser device comprising:
  an active layer;
  a carrier block layer having an energy gap larger than that of a wave guide layer, the carrier block layer being provided on both sides of the active layer;
  wave guide layer provided on an opposite side of the active layer with respect to the carrier block layer;

a clad layer having a refractive index lower than that of the wave guide layer, the clad layer being provided on an opposite side of the active layer with respect to the wave guide layer; and current blocking layers having a refractive index lower than that of the wave guide layer, the current blocking layers being provided to sandwich a stripe-shaped active region therebetween to create a refractive index difference between the active region and buried regions where each of the current blocking layers exists, to form a refractive index guide structure.

The present invention provides a semiconductor laser device comprising:

an active layer:

a carrier block layer having an energy gap larger than that of a wave guide layer, the carrier block layer being provided on both sides of the active layer:

a wave guide layer provided on an opposite side of the active layer with respect to the carrier block layer;

a clad layer having a refractive index lower than that of the wave guide layer, the clad layer being provided on an opposite side of the active layer with respect to the wave guide layer; and current blocking layers having a refractive index lower than that of the wave guide layer, the current blocking layers being provided to sandwich a stripe-shaped active region therebetween to create a refractive index difference between the active region and buried regions where each of the current blocking layers exists, to form a refractive index guide structure, wherein a virtual effective refractive index in an opposite side of the current blocking layers with respect to the active layer is lower than a virtual effective refractive index in a current blocking layer side.

The virtual effective refractive index on the one side with respect to the active layer is defined as an effective refractive index in a symmetric wave guide path structure in which it is assumed that the identical structure exits, as if a mirror image, in the other side with respect to the active layer, and the effective refractive index can be calculated by the effective index method.

Further, in the present invention, it is preferable to lower the virtual effective refractive index by lowering the refractive index of the clad layer which is in the opposite side of the current blocking layers with respect to the active layer.

Further, in the present invention, it is preferable to lower the virtual effective refractive index by lowering the refractive index of the wave guide layer which is in the opposite side of the current blocking layers with respect to the active layer.

Further, in the present invention, it is preferable to lower the virtual effective refractive index by reducing the thickness of the wave guide layer which is in the opposite side of the current blocking layer with respect to the active layer than the thickness of the wave guide layer which is in the current blocking layer side.

Further, in the present invention, it is preferable that the current blocking layers are formed within the wave guide layer to be adjacent to the clad layer.

Further, in the present invention, it is preferable that the current blocking layers are formed within the wave guide layer to be spaced from the clad layer.

Further, in the present invention, it is preferable that when a normalized frequency $V_e$ is defined as $V_e=(\pi \cdot d_e/\lambda) \cdot (N_0^2-N_3^2)^{0.5}$, wherein $\pi$ is the circumference ratio, $N_0$ is a refractive index of the wave guide layer, $N_3$ is a refractive index of the clad layer, $d_e$ is an effective thickness between the clad layers, and $\lambda$ is an oscillation wavelength of a semiconductor laser, $V_e > \pi/3$.

Further, in the present invention, it is preferable that when it is defined that $V_0=(\pi \cdot d_1/\lambda) \cdot (N_1^2-N_0^2)^{0.5}$, wherein $\pi$ is the circumference ratio, $N_0$ is a refractive index of the wave guide layer, $N_2$ and $d_2$ are a refractive index and a thickness of the carrier block layers, respectively, $N_3$ is a refractive index of the clad layer, $d_3$ is a thickness of the wave guide layer including the active layer, barrier layers, side barrier layers and the carrier block layers, and $N_1$ and $d_1$ are a refractive index and a thickness of the active layer, respectively, and when it is defined that $$v_0 = (m \cdot \pi \cdot d_w/\lambda) \cdot (N_w^2 - N_0^2)^{0.5}$$
$$v_1 = (\pi \cdot d_2/\lambda) \cdot (N_0^2 - N_2^2)^{0.5}$$
$$v_2 = (\pi \cdot d_3/\lambda) \cdot (N_0^2 - N_3^2)^{0.5}$$

wherein $N_w$ and $d_w$ are a refractive index and the thickness of the quantum well layer, respectively, when the active layer is a quantum well consisting of m layers, $V_1 < V_2/10$ and $(V_0/3) < V_1 < V_0$ Further, in the present invention, it is preferable that $E > 2.5 \times 10^3/d_2^2$ wherein $d_2$ is the thickness of the carrier block layers (in angstrom) and E is an energy gap difference between the wave guide layer and the carrier block layers (in units of eV, the minimum value adopted if there is an energy gap distribution).

Further, in the present invention, it is preferable that with respect to the effective refractive index difference $\Delta$Neff between the action region and the buried regions, $\Delta$Neff $\geq 0.001$ Further, in the present invention, it is preferable that when the current blocking layers are formed of $Al_xGa_{1-x}As$, X is in a range between 0.0 and 0.7.

Further, in the present invention, it is preferable that when the carrier block layers are formed of $Al_xGa_{1-x}As$, X is in a range between 0.0 to 0.7.

Further, in the present invention, it is preferable that the wave guide layer is formed of GaAs.

Further, in the present invention, it is preferable that the active layer is formed of $In_xG_{1-x}As$.

The structure in the vicinity of the active layer according to the present invention will be described with comparison with the conventional SCH structure which is shown in FIGS. 8(a) and 8(b). The clad layers 2, 7 in the SCH structure shown in FIGS. 8(a) and 8(b) have two functions, one being confinement of carriers and the other being control of a guided mode. Hence, if thicknesses of the wave guide layers 4, 6 are increased, the function of confining carriers is weakened and there are problems such as a degraded differential efficiency. Therefore, in general, the total thickness of the wave guide layer 4, the active layer 5 and the wave guide layer 6 in combination is 0.4 μm or smaller in most cases.

FIG. 8(b) is a graph showing an optical intensity distribution in the guided mods along a Z-axis at the center of the active region 10. In the range covering the wave guide layer 4, the active layer 5 and the wave guide layer 6, the optical intensity changes sinusoidally. In the clad layers 2, 7, the optical intensity changes exponentially. The guided mode exhibits an "exponential" profile which has a wider foot.

In the refractive index guide structure which uses the current blocking layers, a guided mode of the "Gaussian type" is more advantageous than a guided mode of the "exponential type" for the following reasons. That is, in the refractive index guide structure in which the current blocking layers 3 having a low refractive index are formed in the vicinity of the active layer 5 so that a refraction index difference is formed in the traverse direction, the effect of the current blocking layers 3 becomes more remarkable as an electric field intensity at the position where the current blocking layers 3 are formed becomes higher. The current blocking layer 3 is formed 0.1 μm or more apart from the active layer 5 in reality. Comparing a guided mode of the "exponential type" and a guided mode of "Gaussian type," in the region of the current blocking layers 3, the guided mode of "Gaussian type" has a higher electric field intensity and the current blocking layers 3 function more effectively, and hence, it is possible to obtain a large ΔNeff.

FIG. 1(a) is a structure view showing a semiconductor laser of the refractive index guided type according to the present invention, and FIG. 1(b) is a graph showing a guided mode of the semiconductor laser. In FIG. 1(a), on a buffer layer 32 of n-GaAs, a clad layer 31 of n-AlGaAs having a refractive index lower than that of a wave guide layer, a wave guide layer 30 of n-AlGaAs, a carrier block layer 29 of n-AlGaAs and having an energy gap larger than that of the wave guide layer, a side barrier layer 28 of non-doped AlGaAs, an active layer 27 which is formed by two quantum well layers of non-doped GaAs and one barrier layer of non-doped AlGaAs, a side barrier layer 26 of non-doped AlGaAs, a carrier block layer 25 of p-AlGaAs and having an energy gap larger than that of a wave guide layer, a wave guide layer 23 of p-AlGaAs, a clad layer 22 of p-AlGaAs having a refractive index lower than that of the wave guide layer, and a cap layer 21 of p-GaAs are formed in this order. Inside the wave guide layer 23, current blocking layers 24 which have a lower refractive index and a higher Al-composition than that of the wave guide layer 23 are formed as if to sandwich a stripe-shaped active region 34. This structure creates a refractive index difference between the active region 34 and buried regions 33 in which each of the current blocking layers 24 exists, thereby forming a refractive index guide structure.

In the structure shown in FIG. 1(a), since the confinement of injected carriers is performed by the carrier block layers 25, 29, it is possible to design the thicknesses of the wave guide layers 23, 30 freely and independently of confinement of carriers. Using the structure of the present invention, it is possible to form a region ranging from the wave guide layer 23 to the wave guide layer 30 thick, so that the guided mode along a Z-axis at the center of the active region 34 is of the "Gaussian type" as shown in FIG. 1(b). As a result, it is possible to realize an advantageous refractive index guide structure which has an effective refractive index difference ΔNeff larger than that of the conventional structure showing the "exponential type" guided mode.

FIGS. 4(a) to 4(d) are graphs showing results of a calculated effect of the current blocking layers in an AlGaAs/GaAS semiconductor laser. FIGS. 4(a) and 4(b) represents the present invention, while FIGS. 4(c) and 4(d) represent the conventional structure. The tables below show an Al-composition ratio X and a thickness of each layer used for calculation. Table 1 represents the present invention, while Table 2 represents the conventional structure.

TABLE 1

|  | Thickness of active region | Thickness of buried region |
|---|---|---|
| p-side clad layer $Al_xGa_{1-x}As$ (x = 0.33) | 0.8 μm | 0.8 μm |
| p-side wave guide layer $Al_xGa_{1-x}As$ (x = 0.20) | 0.5 μm | (0.5 − dp) μm |
| Current blocking layer $Al_xGa_{1-x}As$ (x = Xb) | — | db μm |
| p-side wave guide layer $Al_xGa_{1-x}As$ (x = 0.20) | — | dp μm |
| p-side carrier block layer $Al_xGa_{1-x}As$ (x = 0.50) | 135 Å | 135 Å |
| p-side barrier layer $Al_xGa_{1-x}As$ (x = 0.20) | 500 Å | 500 Å |
| Active layer (two) quantum well layers GaAs | 110 Å | 110 Å |
| Barrier layer $Al_xGa_{1-x}As$ (x = 0.20) | 60 Å | 60 Å |
| n-side barrier layer $Al_xGa_{1-x}As$ (x = 0.20) | 500 Å | 500 Å |
| n-side carrier block layer $Al_xGa_{1-x}As$ (x = 0.50) | 135 Å | 135 Å |
| n-side wave guide layer $Al_xGa_{1-x}As$ (x = 0.20) | 0.5 μm | 0.5 μm |
| n-side clad layer $Al_xGa_{1-x}As$ (x = 0.33) | 0.8 μm | 0.8 μm |

TABLE 2

|  | Thickness of active region | Thickness of buried region |
|---|---|---|
| p-side clad layer $Al_xGa_{1-x}As$ (x = 0.40) | 1.5 μm | (1.5 − dp) μm |
| Current blocking layer $Al_xGa_{1-x}As$ (x = Xb) | — | db μm |
| p-side clad layer $Al_xGa_{1-x}As$ (x = 0.40) | — | dp μm |
| p-side wave guide layer $Al_xGa_{1-x}As$ (x = 0.20) | 500 Å | 500 Å |
| Active layer (two) quantum well layers GaAs | 110 Å | 110 Å |
| Barrier layer $Al_xGa_{1-x}As$ (x = 0.20) | 60 Å | 60 Å |
| n-side wave guide layer $Al_xGa_{1-x}As$ (x = 0.20) | 500 Å | 500 Å |
| n-side clad layer $Al_xGa_{1-x}As$ (x = 0.40) | 1.5 μm | 1.5 μm |

These calculations were done using the so-called effective index method. After analyzing and calculating the effective refractive indices of the active region and the buried regions each as a multi-layer slab wave guide path, an effective refractive index difference ΔNeff was calculated as a difference between the two values. In FIGS. 4(a) and 4(b), Xb denotes an Al-composition ratio of the current blocking layers 24 of FIG. 1, db denotes the thickness (in units of μm) of the current blocking layers 24, dp denotes a distance (in units of μm) between the top surface of the carrier block layer 25 and the bottom surface of each of the current blocking layers 24. In FIGS. 4(c) and 4(d), Xb denotes an Al-composition ratio of the current blocking layers 3 of FIG. 8, db denotes the thickness of the current blocking layers 3, dp denotes a distance between the top surface of the wave guide layer 4 and the bottom surface of each of the current blocking layers 3.

In each one of the graphs in FIGS. 4(a) to 4(d), there is a general tendency that as dp becomes smaller and the current blocking layers come closer to the active layer, the effective refractive index difference ΔNeff becomes larger, and as the Al composition ratio Xb of the current blocking layers becomes larger, ΔNeff becomes larger, and as the thickness db of the current blocking layers becomes larger, ΔNeff becomes larger. Further, comparing the structure of the present invention and the conventional structure, even if Xb and dp are the same, ΔNeff is larger in the structure of the present invention. Hence, when the structure of the present invention is adopted, the current blocking layers which have a further smaller Al-composition ratio than that of SCH and is stable in processing can be formed far away from the active layer, and hence, a predetermined refractive index difference ΔNeff can be obtained within a region in which cut-off is avoidable. As a result, not only a production margin becomes larger than in the conventional structure, but also the structure as a whole can be manufactured with a low Al-composition, and hence, it is possible to avoid deterioration due to oxidation and deterioration in crystalline quality and to obtain a laser which has a high reliability.

Further, according to the present invention, in the laser device of the refractive index guided type which uses the current blocking layers having a low refractive index, in which the carrier block layers are formed on the both sides of the active layer, the wave guide layers are externally formed on the both sides of the carrier block layers, and the clad layers are externally formed on the both sides of the wave guide layers, the virtual effective refractive index in the opposite side of the current blocking layers with respect to the active layer is lower than the virtual effective refractive index in the current blocking layer side. This positively allows the guided mode to come close to the current blocking layers, and therefore, it is possible to enhance the effect of the current blocking layers. In such a structure, since the guided mode is shifted toward the current blocking layers by the asymmetric wave guide path, it is possible to create large refractive index difference due to the same current blocking layers.

Specific designing in the present invention is performed as described below. The following shows an example of means which realizes a specific method of lowering the virtual effective refractive index in the opposite side of the current blocking layers with respect to the active layer than the virtual effective refractive index in the current blocking layer aide.

For instance, 1) it is possible to realize the asymmetric structure by lowering the refractive index of the clad layer of the opposite side of the current blocking layers with respect to the active layer. In this case, approximating to an asymmetric three-layer wave guide path and analyzing as such, the wave guide path becomes more asymmetric, so that the smaller the refractive index of this clad layer in the range wherein the wave guide structure will not be destroyed, the larger the effect is.

Further, 2) it is possible to realize the asymmetric structure by lowering the refractive index of the wave guide path of the opposite side of the current blocking layers with respect to the active layer. In this case, approximating to an asymmetric four-layer wave guide path and analyzing as such, the refractive index of the wave guide path must be larger than the refractive index of the adjacent clad layer.

Further, 3) the effect described above is obtained, even without changing the refractive index of each layer in reality, but by reducing the thickness of the wave guide layer of the opposite side of the current blocking layers with respect to the active layer smaller than the thickness of the wave guide layer of the current blocking layer side. In this case, since the guided mode exists in the vicinity of the center of the wave guide layers, although overlapping between the active layer and the guided mode, namely, combination gain coefficient, becomes reduced since it is possible to form the current blocking layers close to the vicinity of the center of the guided mode, an additional effect of easy manufacturing of a refractive index guide structure is also expected.

FIG. 2 shows an electric field distribution in the wave guide region and an Al-composition profile of the buried region where the method above is actually used. Conditions which were used for calculation are shown in Table 3. As shown in the drawing, it is possible to shift the guided mode even with use of any method described above. Since overlapping with the current blocking layers becomes larger in the case the current blocking layers are included, it is possible to obtain a predetermined refractive index difference ΔNeff.

TABLE 3 parameters used in calculation

| | | Asymmetric structure | | |
|---|---|---|---|---|
| | Symmetric structure | Clad layer refractive index reduced | Guided layer refractive index reduced | Guided layer thickness changed |
| p-side clad layer | Al$_x$Ga$_{1-x}$As (x = 0.23) | Same as symmetric structure | Same as symmetric structure | Same as symmetric structure |
| p-side wave guide layer | Al$_x$Ga$_{1-x}$As (x = 0.20) 1500 Å | Same as symmetric structure | Same as symmetric structure | (X = 0.20) 2000 Å |
| current exploitation layer (in buried region only) | Al$_x$Ga$_{1-x}$As (xb = 0.50) (db = ) 3000 Å | Same as symmetric structure | Same as symmetric structure | Same as symmetric structure |
| p-side wave guide layer | Al$_x$Ga$_{1-x}$As (x = 0.20) (dp = ) 3000 Å | Same as symmetric structure | Same as symmetric structure | Same as symmetric structure |
| p-side carrier block layer | Al$_x$Ga$_{1-x}$As (x = 0.50) 250 Å | Same as symmetric structure | Same as symmetric structure | Same as symmetric structure |
| p-side barrier layer | Al$_x$Ga$_{1-x}$As (x = 0.20) 500 Å | Same as symmetric structure | Same as symmetric structure | Same as symmetric structure |
| Active layer quantum well layers | GaAs 110 Å | Same as symmetric structure | Same as symmetric structure | Same as symmetric structure |
| Barrier layer | Al$_x$Ga$_{1-x}$As (x = 0.20) 60 Å | | | |
| n-side barrier layer | Al$_x$Ga$_{1-x}$As (x = 0.20) 500 Å | Same as symmetric structure | Same as symmetric structure | Same as symmetric structure |
| n-side carrier block layer | Al$_x$Ga$_{1-x}$As (x = 0.62) 135 Å | Same as symmetric structure | Same as symmetric structure | Same as symmetric structure |
| n-side wave guide layer | Al$_x$Ga$_{1-x}$As (x = 0.20) 4500 Å | Same as symmetric structure | (X = 0.21) 4500 Å | (X = 0.20) 4000 Å |
| n-side clad layer | Al$_x$Ga$_{1-x}$As (x = 0.23) | (x = 0.24) | Same as symmetric structure | Same as symmetric structure |

FIG. 3 shows the refractive index difference ΔNeff between the wave guide region and the buried region of a case where the structure is not made symmetric and that of a case where the structure is made asymmetric by the respective methods above. The calculation was done using the so-called effective index method. After analyzing and calculating the effective refractive index indices of the active regions and the buried regions each as a multi-layer slab wave guide path, the effective refractive index differences $\Delta$Neff were calculated as a difference between the two values. The conditions for the calculation are as shown in Table 3.

In FIG. 3, it is understood that as the Al-composition ratio Xb in the current blocking layers increases, the effective refractive index difference $\Delta$Neff between the active region and the buried region increases. Further, with reference to a case where the structure is not made asymmetric with either one of the methods, $\Delta$Neff with the same Xb becomes larger and the refractive index guide structure is accordingly is formed more effectively.

The methods above may be used together, or alternatively, other existing layer may be changed to have a low refractive index or another low refractive index layer may be newly disposed. Further, it is also possible to obtain a desired refractive index by changing the refractive index stepwise within the layer.

Hence, when a predetermined refractive index difference $\Delta$Neff is to be realized within a region where cut-off is avoidable, by adopting an asymmetric structure, it is possible to form a current blocking layer which contains lower Al-composition and is more stable while processed, at a longer distance from the active layer than in a symmetric structure. As a result, a production margin becomes larger than in the conventional structure and the structure as a whole is manufactured with a low Al-composition, and therefore, it is possible to avoid deterioration due to oxidation and deterioration in crystalline quality and to obtain a semiconductor laser which has a high reliability.

Further, according to the present invention, the current blocking layers 24 are consequently formed within the wave guide layers 23, 30 in many cases. In case of no carrier block layer, holes and electrons which contribute to laser oscillation are co-existing within a wave guide layer, so that introduction of a processing surface into the wave guide layers causes non optical emission recombination of carriers and the oscillation efficiency is remarkably deteriorated with the result that oscillation eventually becomes impossible in most cases. However, in the structure of the present invention, since only either electron or hole can exist outside the carrier block layers 25, 29 with respect to the active layer even inside the wave guide layers 23, 30, recombination of the carriers never occur, which in turn makes it possible to process the wave guide layers without damaging characteristics of a laser.

This is advantageous for manufacturing of a semiconductor laser using an AlGaAs compound semiconductor, for example, which causes intensive deterioration due to oxidation of a processing surface.

FIGS. 9(a) to 9(c) show manufacturing steps for manufacturing a conventional SAS-type semiconductor laser of FIGS. 8(a) and 8(b). First, in FIG. 9(a), by the MBE method, the MOCVD method or the like, the buffer layer 8, the clad layer 7, the wave guide layer 6, the active layer 5, the wave guide layer 4, the clad layer 2, the current blocking layer 3 and a process cap layer 11 of GaAs are grown in this order on an n-GaAs substrate. Next, in FIG. 9(b), after coating a photoresist 12 on the process cap layer 11, and a stripe-shaped window is formed, the current blocking layer 3 and the process cap layer 11 are etched using this window as a mask to form a stripe-shaped groove. Next, in FIG. 9(c), after removing the photoresist 12 and the process cap layer 11, the clad layer 2 and the cap layer 1 at the top are formed during the second crystal growth.

The current blocking layers 3 are usually formed by wet etching. Following this, the clad layer 2 and the cap layer 1 are grown once again above the current blocking layers 3, and hence, re-grown interface surfaces of the respective current blocking layers 3 and the lower clad layer 2 are released into the atmosphere once during laminate formation. At this stage, oxidation of the re-grown interface surfaces is not avoidable. The qualities of the upper clad layer 2 and the cap layer 1 which are formed in the vicinity of the interface surfaces or above are greatly deteriorated. To reduce this influence, surface treatment using processing a fluid containing ammonium sulfide, hydrochloric acid, sulfic acid or the like is performed after wet etching. However, it is difficult to completely remove the influence of oxidation.

With respect to this, in the present invention, since the current blocking layers 24 are formed within the wave guide layer 23 and since the Al content of the wave guide layer 23 is usually less than that in the clad layer 22, it is possible to suppress the influence of oxidation low during the manufacturing steps and to keep the qualities of the layers which are formed at the re-grown interface surfaces or above.

Further, in a SAS-type semiconductor laser using InGaAs for a quantum well, it is possible to form the wave guide layers with GaAs which does not contain Al. If the present invention is applied to such a structure, there is no oxidation at the re-grown interface surfaces during formation of the current blocking layers and it is possible to form excellent layers. As a result, it is possible to form a refractive index guide structure without damaging characteristics of a laser.

In the present invention, specific designing of the active region is carried out in the following manner as described in Japanese Patent Unexamined Publication (koukai) No. 5-505542 (1993).

Under the condition that the thickness of the active layer and the carrier block layers in combination is a fraction or smaller of the oscillation wavelength, where $N_0$ is the refractive index of the wave guide layers, $N_1$ and $d_1$ are the refractive index and the thickness of the active layer, respectively, and $N_2$ and $d_2$ are the refractive index and the thickness of the carrier block layers, respectively, if the following condition:

$$d_1 \cdot (N_1^2 - N_0^2)^{0.5} = 2 \cdot d_2 \cdot (N_0^2 - N_2^2)^{0.5}$$

is satisfied, offset of guiding functions of the active layer and the carrier block layers is almost realized. When the active layer is formed of a number of layers, like a multiple quantum well structure, a quantity corresponding to the left side of the equation is calculated for each layer, and what is obtained by adding up may be used for the left side. Specifically, when the composition of the barrier layer between the quantum wells is equal to that of the wave guide layers, in the case of the active layer which is formed of m layers of quantum wells having refractive indices and thicknesses of $N_w$, $d_w$, when $$m \cdot d_w \cdot (N_w^2 - N_0^2)^{0.5} = 2 \cdot d_2 \cdot (N_0^2 - N_2^2)^{0.5}$$

offset of guiding functions of the active layer and the carrier block layers is almost realized.

Based on a prototype semiconductor laser obtained under the guideline above, the following condition formula which defines $V_0$ is found regarding the carrier block layers:

$$V_0 = (\pi \cdot d_1 / \lambda) \cdot (N_1^2 - N_0^2)^{0.5}$$

When the active layer is formed of m layers of quantum wells, $V_0$ is defined as:

$$V_0 = (m \cdot \pi \cdot d_w / \lambda) \cdot (N_w^2 - N_0^2)^{0.5}$$

Next, $V_1$ is defined as:

$$V_1 = (\pi \cdot d_2/\lambda) \cdot (N_0^2 - N_2^2)^{0.5}$$

Next, where $d_3$ is a thickness of the wave guide layer including the active layer, the barrier layer, the side barrier layer and the carrier block layer and $N_3$ is the refractive index of the clad layer, $V_2$ is defined as:

$$V_2 = (\pi \cdot d_3/\lambda) \cdot (N_0^2 - N_3^2)^{0.5}$$

where $\lambda$ is the oscillation wavelength of the laser.

As clearly understood from the formulas above, $V_0$, $V_1$, $V_2$ correspond to a normalized frequency of the active layer with respect to the wave guide layers, a normalized frequency of the carrier block layers with respect to the wave guide layers and a normalized frequency of the clad layer with respect to the wave guide layers, respectively. $V_0$ and $V_2$ serve as indices showing guiding functions while $V_1$ serves as an index showing an anti guiding function. If the anti guiding function of the carrier block layers is too large, a dent of the guided mode is caused in the vicinity of the active layer. This reduces the light confinement ratio and increases the threshold current. Hence, the influence of the carrier block layers over the guided mode needs to be small. Based on various prototype semiconductor lasers. It is known that when $$V_1 < V_2/10$$

holds, the influence of the carrier block layers over the entire guided mode is small.

Further, it is known that the following condition is particularly effective for the carrier block layers to offset the guided mode of the active layer:

$$V_0/3 < V_1 < V_0$$

On the other hand, where the normalized frequency $V_e$ is defined as:

$$V_0 = (\pi \cdot d_e/\lambda) \cdot (N_0^2 - N_3^2)^{0.5}$$

by satisfying $$V_e > \pi/3$$

since the peak intensity of the guided mode is reduced and it is accordingly possible to make an optical damage level higher at an exit edge surface of the semiconductor laser device, it is possible to sufficiently effectively ensure the effect above. Further, it is preferable that the normalized frequency $V_e$ is $2\pi$ or smaller to avoid a multiple-mode.

If the refractive index of the wave guide layers is constant, $N_0$ has the constant value. However, if the refractive index has a distribution within the wave guide layers, $N_0$ expresses the maximum refractive index value. The effective thickness $d_e$ is calculated by the following formula:

$$d e = \int_{x1}^{x2} (N_w(x) - N_3) dx / (N_0 - N_3)$$

where $N_w(x)$ is the refractive index at an optional position (x) between the two clad layers, x1 is the position of the interface which is close to the active layer of the n-side clad layer, and x2 is the position of the interface which is close to the active layer of the p-side clad layer.

Further, the carrier block layers must effectively confine carriers in the active layer. It is known that carriers are effectively confined in the active layer to a sufficient extent, under the following condition:

$$E > 2.5 \times 10^3 / d_2^2$$

where $d_2$ is the thickness of the carrier block layers (in angstrom) and E is an energy gap difference between the wave guide layers and the carrier block layers (in the unit of eV, the minimum value adopted if there is an energy gap distribution).

Thus, according to the present invention, the carrier block layers having a large band gap, a low refractive index and the anti guiding function are formed on the both sides of the active layer, and the carrier block layers play a function of confining injected electrons and holes within the active layer. As a result, it is not necessary to consider the carrier confirming function with respect to the wave guide layers very much and the freedom of designing the wave guide layers is increased, whereby the guided mode approximates to that of "the Gaussian type." This allows the current blocking layers for forming a refractive index guide structure to contain lower Al-composition and at a longer distance from the active layer. Hence, it is possible to obtain a predetermined refraction index difference within a region where cut-off is avoidable and therefore to obtain a highly reliable semiconductor laser which is stable while processed.

Further, according to the present invention, outside of the carrier block layers with respect to the active layer, since there are only either electrons or holes even within the wave guide layers, it is possible to form the current blocking layers within that region of the wave guide layers without damaging the characteristics of a laser. This suppresses the influence of oxidation of the underlying layers during formation of the current blocking layers and keeps the qualities of the subsequent layers.

Still further, a decrease in the total Al-composition greatly contributes to reductions in the electric resistance and the thermal resistance. Further, since the guided mode is of "the Gaussian type," the beam quality of an emission beam is improved while suppressing the peak optical intensity at a certain optical output, which in turn prevents instantaneous optical damage at the light exit edge surface.

As described above, according to the present invention, in the laser device of the refractive index guided type which uses the current blocking layers having a low refractive index in which the carrier block layers are formed in the both sides of the active layer, the wave guide layers are externally formed in the both sides of the carrier block layers, and the clad layers are externally formed in the both sides of the wave guide layers, the virtual effective refractive index in the opposite side of the current blocking layers with respect to the active layer is lower than the virtual effective refractive index in the current blocking layer side. In this case, since the guided move has large overlapping with the current blocking layers, the current blocking layers effectively exhibit the effect of the same. As a result, during formation of the laser device of the refractive index guided type, designing of the current blocking layers is easy and a production margin is increased.

BRIEF DESCRIPTION OF THE DRAWINGS

FIG. 3 is a graph showing a refractive index difference ΔNeff between the wave guide region and the buried region with respect to an Al-composition Xb of a current blocking layer;

FIG. 8(a) is a structure view showing an example of a conventional semiconductor laser of the refractive index guided type which uses current blocking layers, and FIG. 8(b) is a graph showing a guided mode of the conventional semiconductor laser;

BEST MODE FOR CARRYING OUT THE INVENTION

<First Embodiment>

Figure 5A:
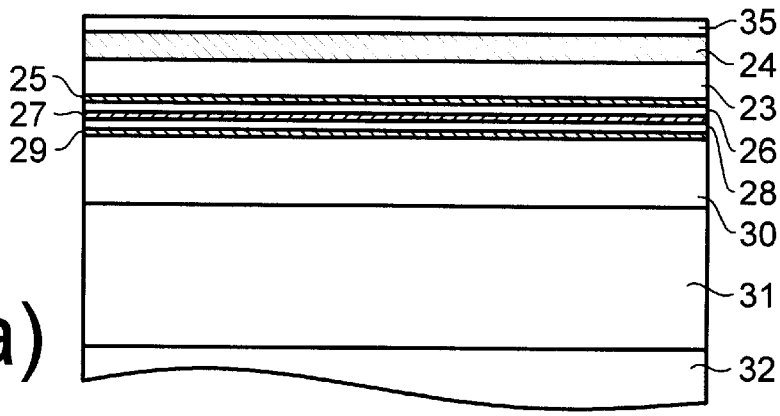
FIGS. 5(a) to 5(c) are step diagrams for describing a method of manufacturing a semiconductor laser element according to the present invention.
Figure 5B:
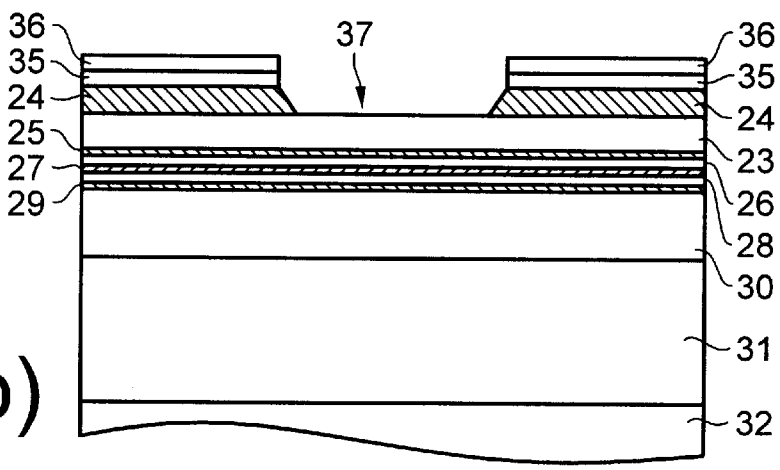
Figure 5C:
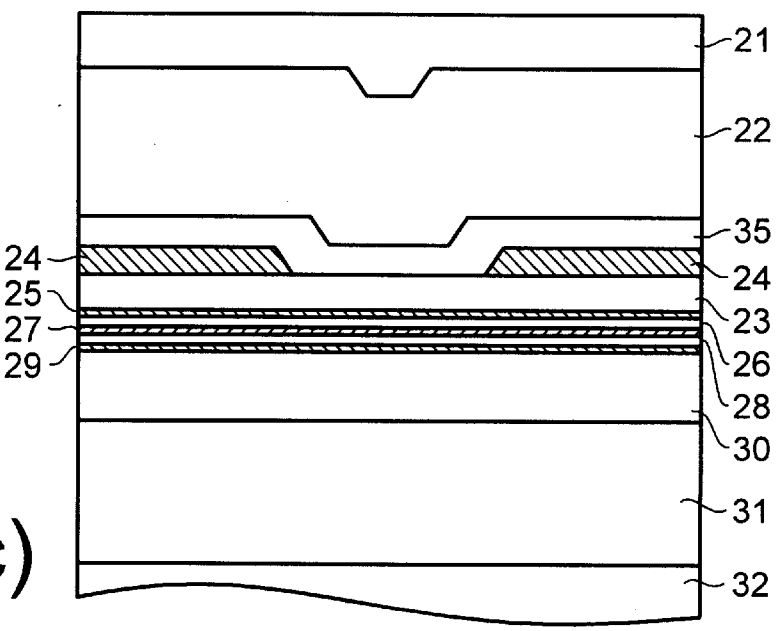

FIGS. 5(a)–(c) are step diagrams for describing a method of manufacturing a semiconductor laser according to a first embodiment of the present invention. In FIG. 5(a), on an n-GaAs substrate, a buffer layer 32 of GaAs (in the thickness of 0.5 μm), an n-side clad layer 31 of $Al_{0.33}Ga_{0.67}As$ (in the thickness of 0.8 μm), an n-side wave guide layer 30 of $Al_{0.20}Ga_{0.80}As$ (in the thickness of 0.5 μm), an n-side carrier block layer 29 of $Al_{0.50}Ga_{0.50}As$ (in the thickness of 0.0135 μm), an n-side barrier layer 28 of $Al_{0.20}Ga_{0.80}As$ (in the thickness of 0.05 μm), an active layer 27 (in the thickness of 0.028 μm) which is formed by two GaAs quantum well layers (in the thickness of 0.011 μm) and a barrier layer of $Al0.20Ga_{0.80}As$ (in the thickness of 0.006 μm) which interpolates the quantum well layers, a p-side barrier layer 26 of $Al_{0.20}Ga_{0.80}As$ (in the thickness of 0.05 μm), a p-side carrier block layer 25 of $Al_{0.50}Ga_{0.50}As$ (in the thickness of 0.0135 μm), a p-side wave guide layer 23 of $Al_{0.20}Ga_{0.80}As$ (in the thickness of 0.2 μm), a current blocking layer 24 of $Al_{0.40}Ga_{0.60}As$ (in the thickness of 0.5 μm), and a process cap layer 35 of GaAs (in the thickness of 0.1 μm) are grown in this order. While the MOCVD method is used for the first crystal growth, other crystal growth method such as the MBE method may be used.

Next, in FIG. 5(b), a photoresist 36 is coated on the process cap layer 35. A window having a desired stripe width is formed in the photoresist by a pholithographic method. Using the window as a mask, the current blocking layer 24 are wet-etched, thereby forming a stripe-shaped groove portion 37 which extends in a direction vertical to drawing paper. During the etching step, since the current blocking layer 24 has been formed immediately close to the active layer 27 in a conventional technique, excessive etching often has damaged the active layer. This has resulted in a small production margin, and hence, a highly accurate etching technique to replace this has been demanded. Since the current blocking layers 24 are formed far away from the active layer 27 in the present invention, the groove portion 37 is formed without damaging the active layer 27.

Next, the photoresist 36 is removed. After removing the process cap layer 35 by surface cleaning, during the second crystal growth, an upper p-side wave guide layer 23 of $Al_{0.20}Ga_{0.80}As$ (in the thickness of 0.3 μm), a p-side clad layer 22 of $Al_{0.33}Ga_{0.67}As$ (in the thickness of 0.8 μm), and a cap layer 21 of p-GaAs (in the thickness of 2 μm) are formed in this order, thereby obtaining the semiconductor laser device of the present invention shown in FIG. 5(c). Following this, electrodes are formed to the substrate and the cap layer 21. As a current is allowed to flow, carrier injection enables laser oscillations.

Figures 4A, 4B, 4C, 4D:
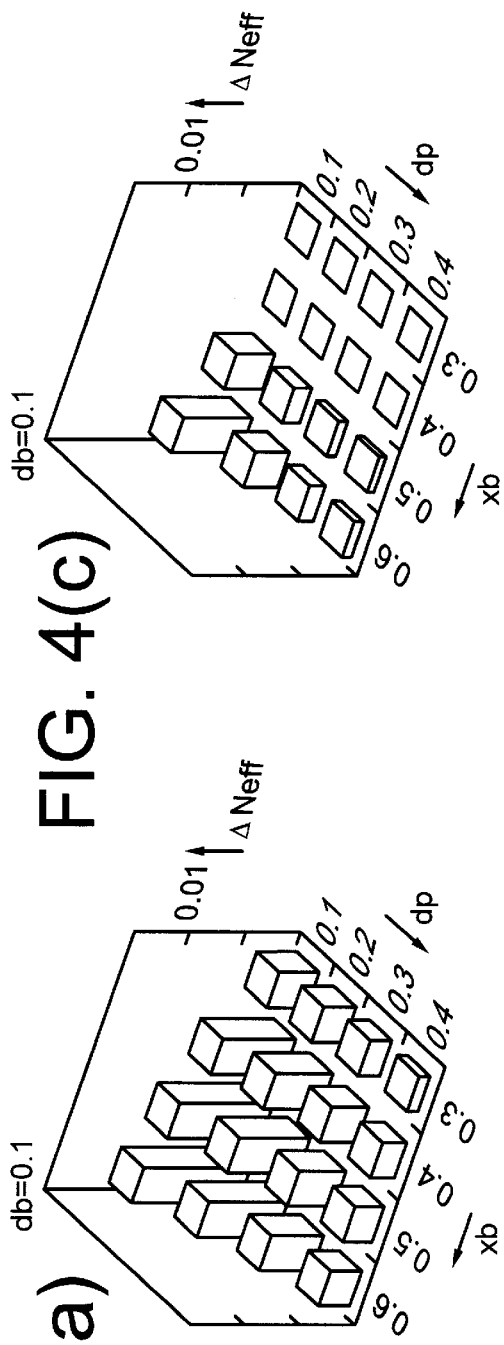
FIGS. 4(a) and 4(b) are graphs showing results of a calculated effect of the current blocking layer in an AlGAs/GaAs semiconductor laser according to the present invention.
FIGS. 4(c) and 4(d) are graphs showing results of a calculated effect of the current blocking layer in an AlGaAs/GaAs semiconductor laser according to a conventional structure.

Immediately before the second crystal growth, the substrate which is being manufactured is aerated to the atmosphere. During this, in the conventional technique, since the Al-composition at the processed surface has been high, an oxidation film has been formed at the surface and the subsequent crystal qualities have been deteriorated. However, in the present invention, since the Al-composition at the processed surface is low, oxidation does not progress much and highly reliable crystal growth which ensures excellent crystal qualities is possible. According to the calculation results shown in FIG. 4(b), ΔNeff is 0.008. This is a refractive index difference which is sufficient to realize a refractive index guide structure.

Figure 10B:
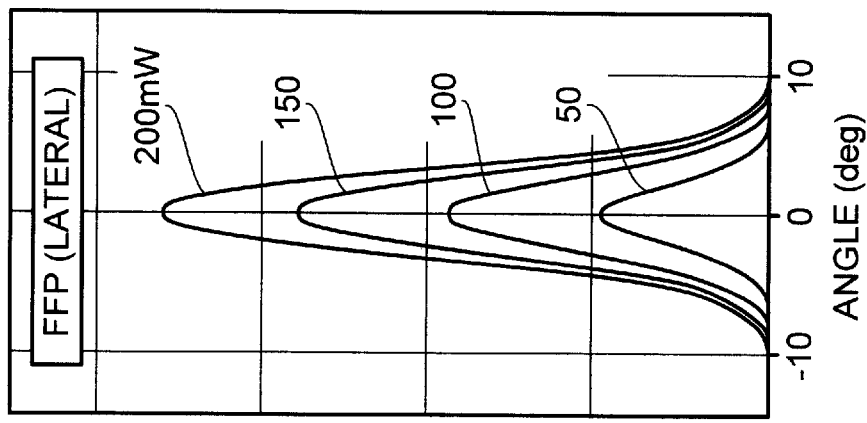
FIG. 10(b) is a view of a far-field pattern.
Figure 10A:
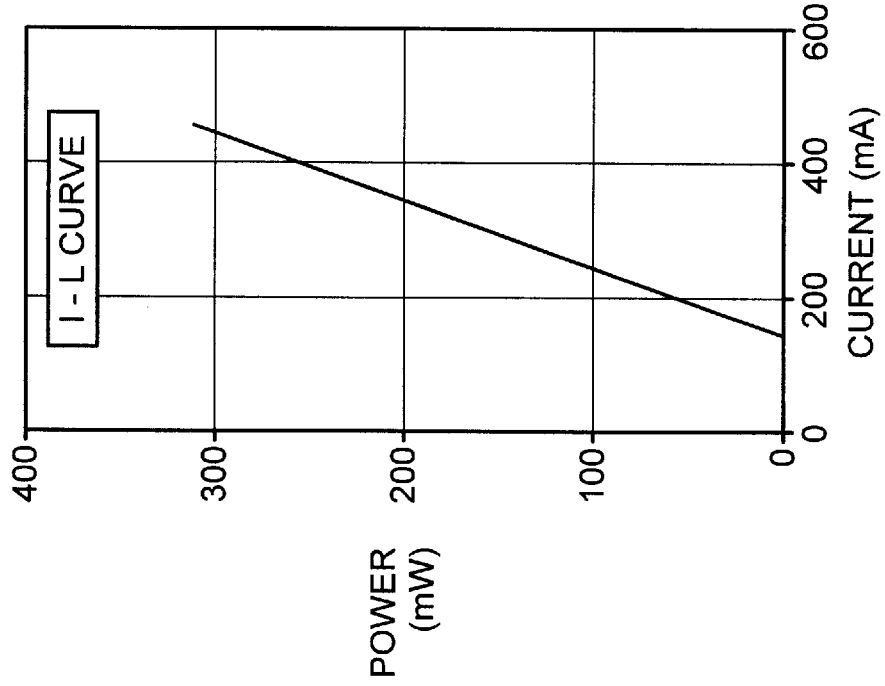
FIG. 10(a) is a view showing a current-optical output characteristic of the semiconductor laser according to a first embodiment.

The semiconductor laser device which is obtained in this manner has a stripe width of 6 μm, a resonator length of 500 μm, a threshold current of 40 mA and the slope efficiency of 1.0 W/A with a coating of 96%/4%. Further, as shown in FIG. 10, an excellent current-optical output characteristic which exhibits linearity without a kink up to an output of 200 mW is obtained. A far-field pattern of the laser beam is of the Gaussian type with single peak. Thus, the resulting refractive index guide structure is to be excellent.

With this structure, $V_0=0.0847$, $V_1=0.0564$, $V_2=3.283$ and Ve=3.200.

<Second Embodiment>

Figure 1:
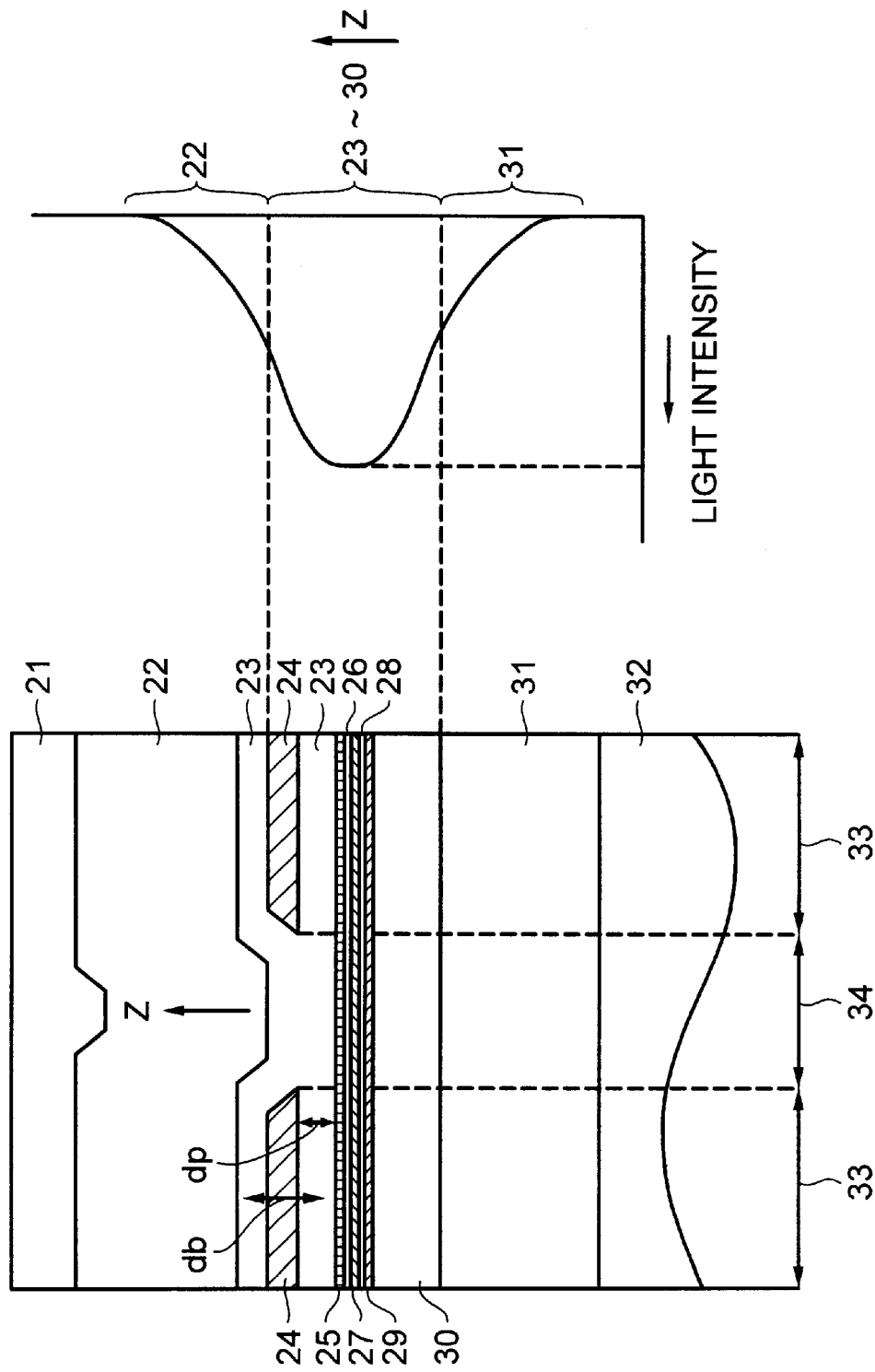
FIG. 1(a) is a structure view showing a semiconductor laser of the refractive index guided type according to the present invention.
FIG. 1(b) is a graph showing a guided mode of the semiconductor laser.
Figure 2:
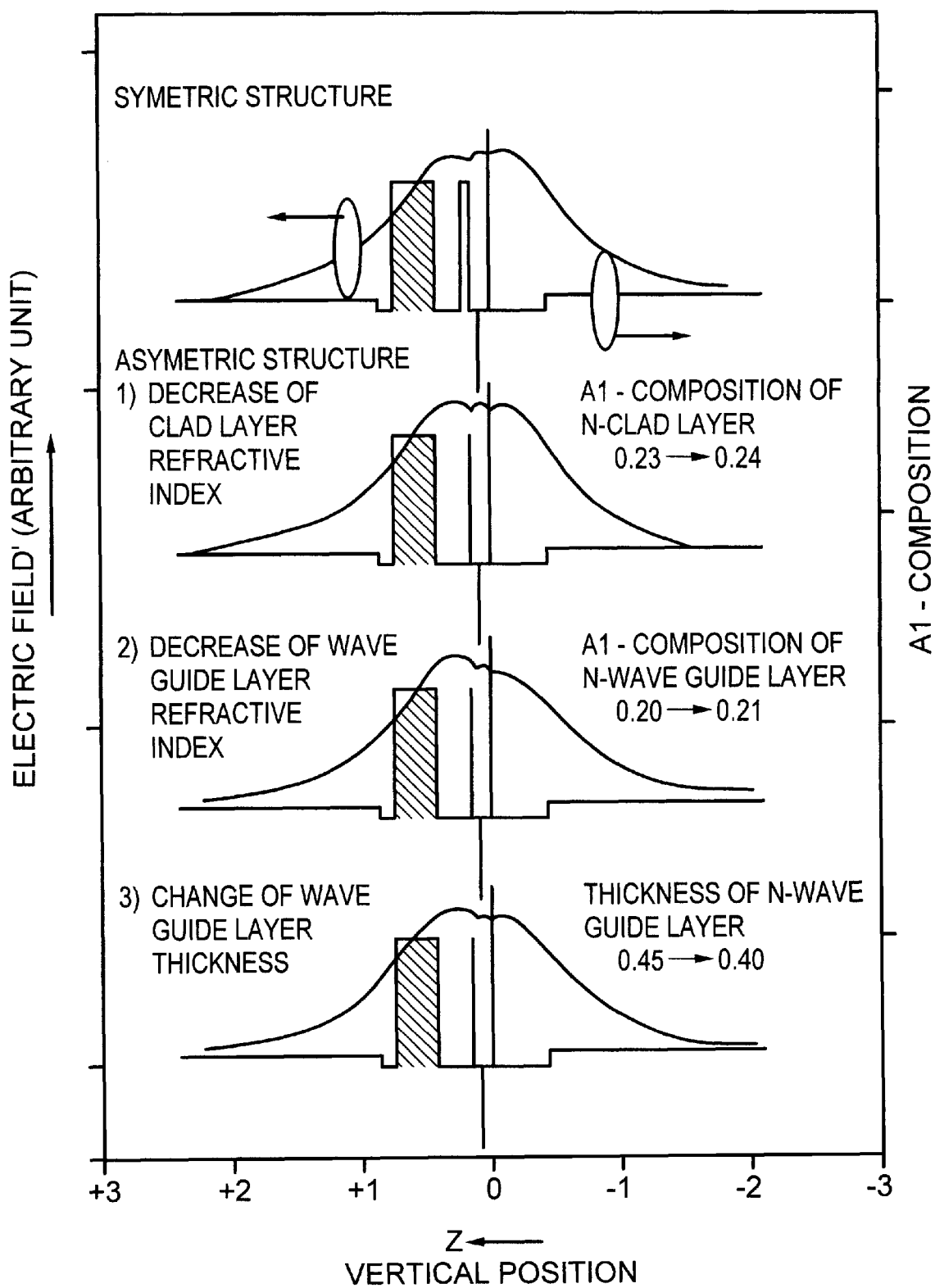
FIG. 2 is a graph showing an electric field distribution in a wave guide region and an Al-composition profile of a buried region in an asymmetric structure which is obtained by each method.

As a second embodiment of the present invention, application of the structure shown in FIG. 1(a) to an InGaAs distortion quantum well laser will be described. As in the first embodiment, in FIG. 5(a), on an n-GaAs substrate, a buffer layer 32 of GaAs (in the thickness of 0.5 μm), an n-side clad layer 31 of $Al_{0.12}Ga_{0.88}As$ (in the thickness of 0.9 μm), an n-side wave guide layer 30 of GaAs (in the thickness of 0.6 μm), an n-side carrier block layer 29 of $Al_{0.30}Ga_{0.70}As$ (in the thickness of 0.0135 μm), an n-side barrier layer 28 of GaAs (in the thickness of 0.05 μm), an active layer 27 (in the thickness of 0.033 μm) which is formed by three $In_{0.20}Ga_{0.80}As$ quantum well layers (in the thickness of 0.007 μm) and two barrier layers of GaAs (in the thickness of 0.006 μm) which interpolate the quantum well layers, a p-side barrier layer 26 of GaAs (in the thickness of 0.05 μm), a p-side carrier block layer 25 of $Al_{0.30}Ga_{0.70}As$ (in the thickness of 0.0135 μm), a p-side wave guide layer 23 of GaAs (in the thickness of 0.2 μm), a current blocking layer 24 of $Al_{0.20}Ga_{0.80}As$ (in the thickness of 0.5 μm), and a process cap layer 35 of GaAs (in the thickness of 0.1 μm) are grown in this order.

Next, in FIG. 5(b), a photoresist 36 is coated on the process cap layer 35. A window having a desired stripe width is formed in the photoresist. Using the window as a mask, the current blocking layer 24 is wet-etched, thereby forming a stripe-shaped groove portion 37.

Next, the photoresist 36 is removed. After removing the process cap layer 35 by surface cleaning, during the second crystal growth, an upper p-side wave guide layer 23 of GaAs (in the thickness of 0.4 μm), a p-side clad layer 22 of $Al_{0.12}Ga_{0.88}As$ (in the thickness of 0.9 μm), and a cap layer 21 of p-GaAs (in the thickness of 2 μm) are formed in this order, thereby obtaining the semiconductor laser device of the present invention which is shown in FIG. 5(c). Following this, electrodes are formed to the substrate and the cap layer 21. As a current is allowed to flow, carrier injection enables laser oscillations. In this embodiment, in particular, since the re-growth interface is of GaAs, oxidation of Al is prevented. Hence, highly reliable crystal growth which ensures excellent crystal qualities is possible.

The semiconductor laser which is obtained in this manner has a threshold current of 30 mA and a slope efficiency of 1.0 W/A. Further, an excellent current-optical output characteristic which exhibits linearity without a kink up to an output of 100 mW is obtained. A far-field pattern of the laser beam is of the Gaussian type with single peak. Thus, the resulting refractive index guide structure is to be excellent.

Thus, by means of the current blocking layer which contains lower Al-composition and is formed farther from the active layer than in the conventional structure, it is possible to obtain an excellent refractive index guide structure and hence a reliable semiconductor with a large production margin.

The present invention is not limited to the embodiments described above. Rather, the present invention is applicable to semiconductor lasers of various types of structures and compositions.

<Third Embodiment>

Figure 6:
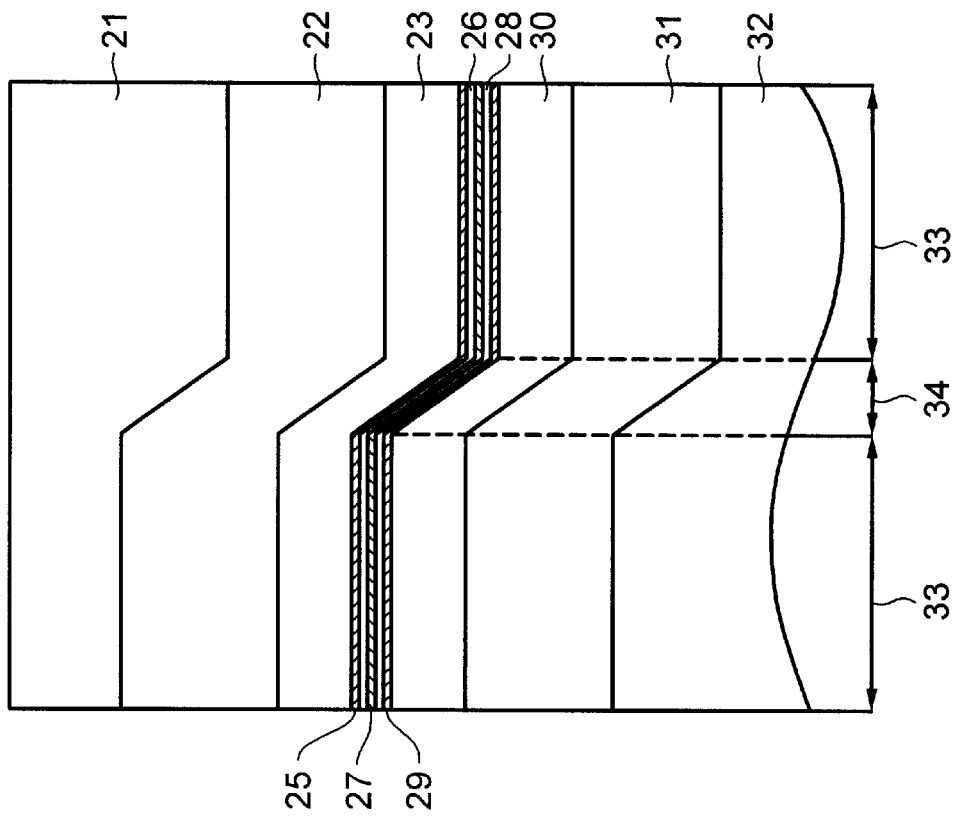
FIG. 6 is a structure view showing an example of a semiconductor laser of the ridge refractive index guided type to which the present invention is applicable.

FIG. 6 is a structure view showing an example of a semiconductor laser of the ridge refractive index guided type to which the present invention is applicable. In FIG. 6, on an n-GaAs substrate (not shown), a buffer layer 32 of n-GaAs (in the thickness of 0.5 μm), a clad layer 31 of n-$Al_{0.33}Ga_{0.67}As$ (in the thickness of 0.8 μm), a wave guide layer 30 of n-$Al_{0.20}Ga_{0.80}As$ (in the thickness of 0.5 μm), a carrier block layer 29 of n-$Al_{0.50}Ga_{0.50}As$ (in the thickness of 0.0135 μm), a side barrier layer 28 of non-doped $Al_{0.20}Ga_{0.80}As$ (in the thickness of 0.05 μm), an active layer 27 (in the thickness of 0.028 μm) which is formed by two non-doped GaAs quantum well layers (in the thickness of 0.011 μm) and a barrier layer of $Al_{0.20}Ga_{0.80}As$ (in the thickness of 0.006 μm), a side barrier layer 26 of non-doped $Al_{0.20}Ga_{0.80}As$ (in the thickness of 0.05 μm), a carrier block layer 25 of p-$A_{0.50}Ga_{0.50}As$ (in the thickness of 0.0135 μm), a wave guide layer 23 of p-$Al_{0.20}Ga_{0.80}As$ (in the thickness of 0.5 μm), a clad layer 22 of p-$Al_{0.33}Ga_{0.67}As$ (in the thickness of 0.8 μm), and a process cap layer 35 of p-GaAs are grown in this order.

Next, an inorganic film of $SiO_2$ or the like is deposited by vacuum evaporation or the like. A window having a desired stripe width is formed in the inorganic film by a photolithographic method, and using this as a mask, a portion of the clad layer 22 which will become the buried region 33 and a portion of the wave guide layer 23 are removed. Following this, as the second crystal growth, current blocking layers 24 of $Al_{0.40}Ga_{0.60}As$ is buried. This is realized by selective growth. After removing the inorganic film used as the mask, during the third crystal growth, a cap layer 21 of p-GaAs (in the thickness of 2 μm) is formed. Next electrodes are formed on the substrate and the cap layer 21. As a current is allowed to flow, carrier injection enables laser oscillations.

The current blocking layers 24 having a lower refractive index and higher Al-composition content than that of the wave guide layer 23 are formed to sandwich the stripe-shaped active region 34, on the both sides of the clad layer 22. This creates a refractive index difference between the active region 34 and the buried regions 33 in which each of the current blocking layers 24 exists, thereby forming a refractive index guide structure.

When the structure of the present invention is applied to a semiconductor laser device of the ridge type in this manner, it is possible to realize an excellent refractive index guide structure by means of the current blocking layers which contain lower Al-composition and is formed farther from the active layer than in the conventional structure.

The semiconductor laser device which is obtained in this manner has a threshold current of 30 mA and the slope efficiency of 1.0 W/A. Further, excellent current-optical output characteristic which exhibits linearity without a kink up to an output of 100 mW is obtained. A far-field pattern of the laser beam is of the Gaussian type with single peak. Thus, the resulting refractive index guide structure is to be excellent.

<Fourth Embodiment>

Figure 7:
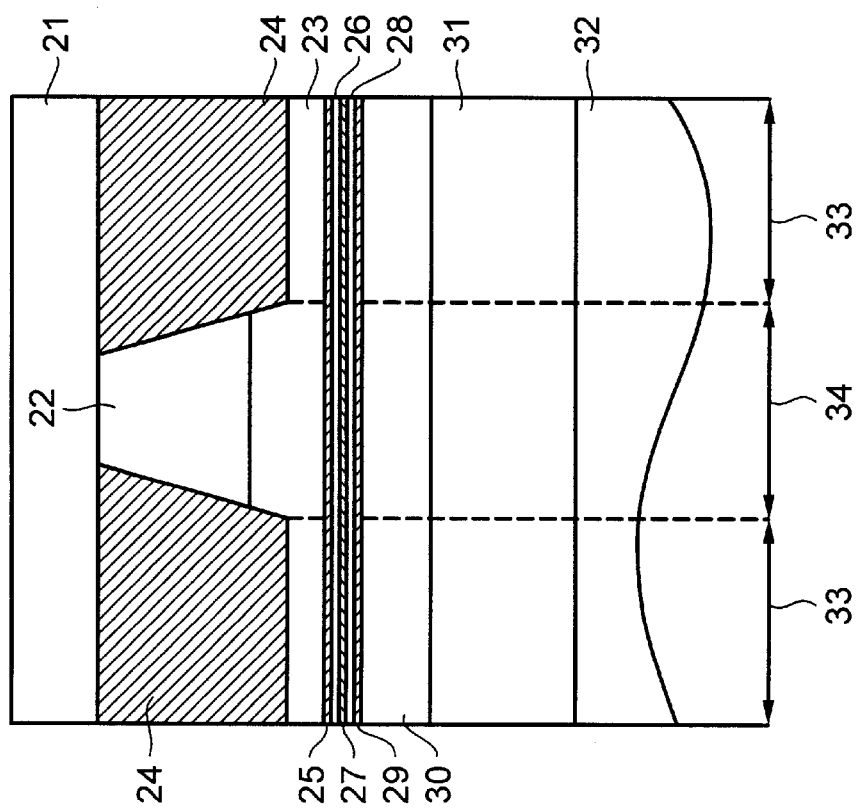
FIG. 7 is a structure view showing an example of a semiconductor laser of the TJS refractive index guided type to which the present invention is applicable.
Figure 9A:
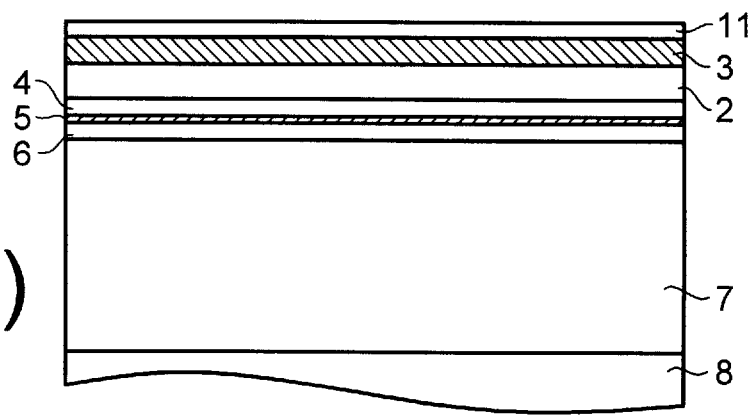
FIGS. 9(a) to 9(c) are step diagrams showing manufacturing steps of the conventional SAS semiconductor laser of FIG. 8.
Figure 9B:
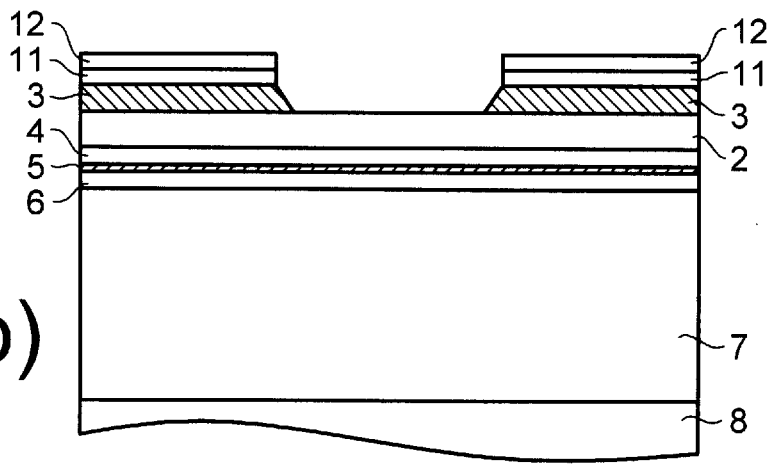
Figure 9C:
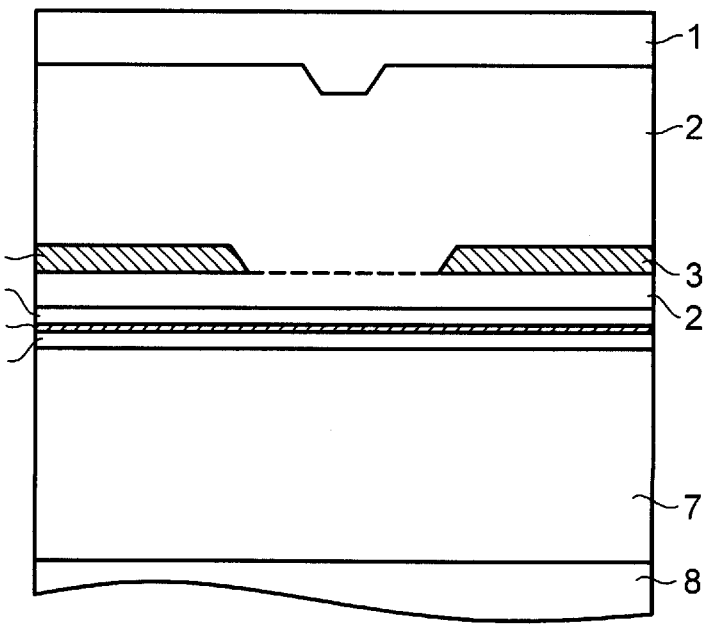

FIG. 7 is a structure view showing an example of a semiconductor laser of the TJS refractive index guided type to which the present invention is applicable. In FIG. 7, on the buffer layer 32 of n-GaAs, a clad layer 31 of a-AlGaAs, a wave guide layer 30 of n-AlGaAs, a carrier block layer 29 of n-AlGaAs, a side barrier layer 28 of non-doped AlGaAs, an active layer 27 which is formed by two non-doped GaAs quantum well layers and a barrier layer of non-doped AlGAs, a side barrier layer 26 of non-doped AlGaAs, a carrier block layer 25 of p-AlGaAs, a wave guide layer 23 of p-AlGaAS, a clad layer 22 of p-AlGaAs, and a cap layer 21 of p-GaAs are grown in this order. In this case, although no current blocking layer is provided specifically, reflecting the configuration of the substrate, the buried region 33 has a small effective refractive index, whereby a refractive index guide structure is obtained.

<Fifth To Seventh Embodiments And Reference Examples>

Next, a description will be given on a method of enhancing the effect of the current blocking layers by forming the wave guide path in an asymmetric structure, in relation to embodiments.

A semiconductor laser device was manufactured using the same process as that in the first embodiment.

The compositions and the thicknesses of the respective layers which were used for that purpose are as shown in Table 4.

TABLE 4

Parameters used for embodiments

| | | Asymmetric structure | | |
|---|---|---|---|---|
| | (Reference examples) Symmetric structure | Embodiment 5 (1) Clad layer refractive index reduced | Embodiment 6 (2) Guided layer refractive index reduced | Embodiment 7 (3) Guided layer thickness changed |
| p-side clad layer | $Al_xGa_{1-x}As$ (x = 0.23) | Same as symmetric structure | Same as symmetric structure | Same as symmetric structure |
| p-side wave guide layer | $Al_xGa_{1-x}As$ (x = 0.20) 1500 Å | Same as symmetric structure | Same as symmetric structure | (X = 0.20) 2000 Å |
| Current blocking layer (in buried region only) | $Al_xGa_{1-x}As$ (Xb = 0.50) (db = ) 3000 Å | (Xb = 0.40) 3000 Å | (Xb = 0.40) 3000 Å | (Xb = 0.40) 3000 Å |
| p-side wave guide layer | $Al_xGa_{1-x}As$ (x = 0.20) (dp = ) 3000 Å | Same as symmetric structure | Same as symmetric structure | Same as symmetric structure |
| p-side carrier block layer | $Al_xGa_{1-x}As$ (x = 0.50) 250 Å | Same as symmetric structure | Same as symmetric structure | Same as symmetric structure |
| p-side barrier layer | $Al_xGa_{1-x}As$ (x = 0.20) 500 Å | Same as symmetric structure | Same as symmetric structure | Same as symmetric structure |
| Active layer quantum well layers | GaAs 110 Å | Same as symmetric structure | Same as symmetric structure | Same as symmetric structure |
| Barrier layer | $Al_xGa_{1-x}As$ (x = 0.20) 60 Å | | | |
| n-side barrier layer | $Al_xGa_{1-x}As$ (x = 0.20) 500 Å | Same as symmetric structure | Same as symmetric structure | Same as symmetric structure |
| n-side carrier block layer | $Al_xGa_{1-x}As$ (x = 0.62) 135 Å | Same as symmetric structure | Same as symmetric structure | Same as symmetric structure |
| n-side wave guide layer | $Al_xGa_{1-x}As$ (x = 0.20) 4500 Å | Same as symmetric structure | (X = 0.21) 4500 Å | (X = 0.20) 4000 Å |
| n-side clad layer | $Al_xGa_{1-x}As$ (x = 0.23) | (x = 0.24) | Same as symmetric structure | Same as symmetric structure |
| Δ Neff | 0.00409 | 0.00505 | 0.00470 | 0.00473 |

The semiconductor laser device which is obtained in this manner has a stripe width of 6 μm, a resonator length of 500 μm, a threshold current of 40 mA and the slope efficiency is 1.0 W/A with a coating of 96%/4%. Further, an excellent current-optical output characteristic which exhibits linearity without a kink up to an output of 200 mW is obtained. A far-field pattern of the laser beam is of the Gaussian type with single peak. Thus, the resulting refractive index guide structure is to be excellent.

Thus, with either method, even with current blocking layers which contain lower Al-composition than the reference examples (symmetric), a large ΔNeff is obtained because of an asymmetric structure, and hence, an excellent device is created. Further, in an device having an asymmetric structure, a similar effect is obtained by increasing the distance from the carrier block layer instead of reducing the Al-composition of the current blocking layer. Reduction in Al-composition and increase in distance allow to create the device by a larger margin.

<Reference Examples>

As a reference example, an example of a case where the device is not formed in an asymmetric structure will be described. A process is similar to those of the embodiments. The compositions and the thicknesses are as shown in Table 4.

The present invention is not limited to the embodiments described are, but rather in applicable to semiconductor lasers of various types of structures and compositions.

Further, materials for forming a semiconductor laser do not necessarily include all of Ga, Al and As. Rather, other materials may be added. For instance, the present invention is applicable to semiconductor lasers of any refractive index guided type, such as a strained quantum well laser which uses InGaAs as an active layer. In addition, with respect to the structure of the active layer, the present invention is applicable to the so-called GRIN (Graded-Index) structure and the DH (Double Heterostructure) structure as well.

<EFFECT OF THE INVENTION>

As described above, according to the present invention, since the carrier block layers confines injected carriers in the active layer and since the current blocking layers which contain lower Al-composition and is formed farther from the active layer than in the conventional structure, it is possible to obtain a predetermined refractive index difference. Hence, it is possible to obtain a reliable a semiconductor laser of the refractive index guided type which is easy to manufacture.

Further, by adopting the asymmetric wave guide path, the guided mode is shifted toward the current blocking layers, and therefore, a larger refractive index difference is created. Hence, the distance between the current blocking layers and the active layer and the margin with respect to the Al-composition are increased, so that it is easy to manufacture and the design freedom is enhanced.

Still further, since it is possible to suppress the Al-compositions in the layers other than the current blocking layers, the influence of oxidation is reduced while improving electrical characteristics, thermal characteristics, optical characteristics and the like.

Thus, it is possible to obtain a high-output semiconductor laser device of the refractive index guided type which is easy to manufacture.

What is claimed is:

1. A semiconductor laser device comprising in the following sequence:
    a substrate;
    a first clad layer having a first conductive type,
    a first wave guide layer having a first conductive type,
    a first carrier block layer having a first conductive type, and confining carriers to an active layer;
    the active layer;
    a second carrier block layer having a second conductive type, and confining carriers to the active layer;
    a second wave guide layer having a second conductive type, and
    a second clad layer having a second conductive type, and further comprising:
        both said first and second carrier block layers having energy gaps larger than those of said first and second wave guide layers;
        both said first and second clad layers having refractive indices lower than those of said first and second wave guide layers;
        a current blocking layer, formed so that at least a part of one of the first and second said wave guide layer is interposed between the current blocking layer and the nearer carrier block layer, having the opposite conductive type to that of the adjacent wave guide layer, and having a refractive index lower than refractive indices of said adjacent wave guide layer, and said current blocking layer being formed from two portions so as to sandwich a stripe-shaped active region therebetween to create a refractive index difference between the active region and buried regions where each of the current blocking layers exists to form a refractive index guide structure.

2. The semiconductor laser device of claim 1, wherein a virtual effective refractive index on an opposite side of said current blocking layer with respect to said active layer is lower than a virtual effective refractive index on a current blocking layer side.

3. The semiconductor laser device of claim 2, wherein the virtual effective refractive index is lowered by lowering a refractive index of one of the first and the second clad layers which is on the opposite side of said current blocking layer with respect to said active layer than a refractive index of the other clad layer which is on a current blocking layer side.

4. The semiconductor laser device of claim 2, wherein the virtual effective refractive index is lowered by lowering a refractive index of one of the first and the second wave guide layer which is on the opposite side of said current blocking layer with respect to said active layer than a refractive index of the other wave guide layer which is on a current blocking layer side.

5. The semiconductor laser device of claim 2, wherein the virtual effective refractive index is lowered by reducing a thickness of one of the first and the second wave guide layers which is on the opposite side of said current blocking layer with respect to said active layer to less than a thickness of the other wave guide layer which is on a current blocking layer side.

6. The semiconductor laser device of claim 1, wherein the portions of said current blocking layer are formed within one of the first and second said wave guide layers to be adjacent to one of the first and the second said clad layers.

7. The semiconductor laser device of claim 1, wherein the portions of said current blocking layer are formed within one of the first and second said wave guide layers to be spaced from one of said clad layers having the same conductive type as said one of the wave guide layers.

8. The semiconductor laser device of claim 6, wherein a normalized frequency $V_e$ is defined as $$V_e = (\pi \cdot d_e/\lambda) \cdot (N_0^2 - N_3^2)^{0.5},$$

wherein $\pi$ is the circumference ratio, $N_0$ is a maximum value of refractive index of said first and second wave guide layers, $N_3$ is a refractive index of said clad layer on the current blocking layer side, $d_e$ is an effective thickness between said clad layers, and $\lambda$ is an oscillation wavelength of a semiconductor laser, $$V_e > \pi/3.$$

9. The semiconductor laser device of claim 6, wherein, $$V_1 = (\pi \cdot d_2/\lambda) \cdot (N_0^2 - N_3^2)^{0.5}$$

and $$V_2 = (\pi \cdot d_3/\lambda) \cdot (N_0^2 - N_3^2)^{0.5}$$

wherein $\pi$ is the circumference ratio, $N_0$ is maximum value of a refractive index of the first and the second wave guide layers, $N_2$ and $d_2$ are a refractive index and a thickness of one of said carrier block layers, respectively, $N_3$ is a refractive index of said clad layer on the current blocking layer side, and $d_3$ is a thickness of an active region sandwiched between the first and the second clad layers, $$V_1 < V_2/10.$$

10. The semiconductor laser device of claim 8, wherein the portions of said current blocking layer are formed of $Al_xGa_{1-x}As$, X is in a range between 0.0 and 0.7.

11. The semiconductor laser device of claim 8, wherein said carrier block layers are formed of $Al_xGa_{1-x}As$, wherein X is in a range between 0.0 and 0.7.

12. The semiconductor laser device of claim 8, wherein said wave guide layers are formed of GaAs.

13. The semiconductor laser device of claim 9, wherein the portions of said current blocking layer are formed of $Al_xGa_{1-x}As$, X is in a range between 0.0 and 0.7.

14. The semiconductor laser device of claim 9, wherein said carrier block layers are formed of $Al_xGa_{1-x}As$, wherein X is in a range between 0.0 and 0.7.

15. The semiconductor laser device of claim 9, wherein said wave guide layers are formed of GaAs.

16. The semiconductor laser device of claim 7, wherein, when a normalized frequency $V_0$ is defined as $$V_e = (\pi \cdot d_e/\lambda) \cdot (N_0^2 - N_3^2)^{0.5},$$

wherein $\pi$ is the circumference ratio, $N_0$ is a maximum value of refractive index of said first and second wave guide layers, $N_3$ is a refractive index of said clad layer on the current blocking layer side, $d_e$ is an effective thickness between said clad layers, and $\lambda$ is an oscillation wavelength of a semiconductor laser, $$V_e > \pi/3.$$

17. The semiconductor laser device of claim 7, wherein, $$V_1 = (\pi \cdot d_2/\lambda) \cdot (N_0^2 - N_3^2)^{0.5}$$

and $$V_2 = (\pi \cdot d_3/\lambda) \cdot (N_0^2 - N_3^2)^{0.5}$$

wherein $\pi$ is the circumference ratio, $N_0$ is maximum value of a refractive index of the first and the second wave guide layers, $N_2$ and $d_2$ are a refractive index and a thickness of one of said carrier block layers, respectively, $N_3$ is a refractive index of said clad layer on the current blocking layer side, and $d_3$ is a thickness of an active region sandwiched between the first and the second clad layers, $$V_1 < V_2/10.$$

18. The semiconductor laser device of claim 16, wherein the portions of said current blocking layer are formed of $Al_xGa_{1-x}As$, X is in a range between 0.0 and 0.7.

19. The semiconductor laser device of claim 16, wherein said carrier block layers are formed of $Al_xGa_{1-x}As$, wherein X is in a range between 0.0 and 0.7.

20. The semiconductor laser device of claim 16, wherein said wave guide layers are formed of GaAs.

21. The semiconductor laser device of claim 17, wherein the portions of said current blocking layer are formed of $Al_xGa_{1-x}As$, X is in a range between 0.0 and 0.7.

22. The semiconductor laser device of claim 17, wherein said carrier block layers are formed of $Al_xGa_{1-x}As$, wherein X is in a range between 0.0 and 0.7.

23. The semiconductor laser device of claim 17, wherein said wave guide layers are formed of GaAs.

24. The semiconductor laser device of claim 2, wherein portions of said current blocking layer are formed within one of the first and second said wave guide layers to be adjacent to one of the first and the second said clad layers.

25. The semiconductor laser device of claim 2, wherein portions of said current blocking layer are formed within one of the first and second said wave guide layers to be spaced from one of said clad layers having the same conductive type as said one of the wave guide layers.

26. The semiconductor laser device of claim 24, wherein, when a normalized frequency $V_0$ is defined as $$V_e = (\pi \cdot d_e/\lambda) \cdot (N_0^2 - N_3^2)^{0.5},$$

wherein $\pi$ is the circumference ratio, $N_0$ is a maximum value of refractive index of said first and second wave guide layers, $N_3$ is a refractive index of said clad layer on the current blocking layer side, $d_e$ is an effective thickness between said clad layers, and $\lambda$ is an oscillation wavelength of a semiconductor laser, $$V_e > \pi/3.$$

27. The semiconductor laser device of claim 24, wherein, $$V_1 = (\pi \cdot d_2/\lambda) \cdot (N_0^2 - N_3^2)^{0.5}$$

and $$V_2 = (\pi \cdot d_3/\lambda) \cdot (N_0^2 - N_3^2)^{0.5}$$

wherein $\pi$ is the circumference ratio, $N_0$ is maximum value of a refractive index of the first and the second wave guide layers, $N_2$ and $d_2$ are a refractive index and a thickness of one of said carrier block layers, respectively, $N_3$ is a refractive index of said clad layer on the current blocking layer side, and $d_3$ is a thickness of an active region sandwiched between the first and the second clad layers, $$V_1 < V_2/10.$$

28. The semiconductor laser device of claim 26, wherein the portions of said current blocking layer are formed of $Al_xGa_{1-x}As$, X is in a range between 0.0 and 0.7.

29. The semiconductor laser device of claim 26, wherein said carrier block layers are formed of $Al_xGa_{1-x}As$, wherein X is in a range between 0.0 and 0.7.

30. The semiconductor laser device of claim 26, wherein said wave guide layers are formed of GaAs.

31. The semiconductor laser device of claim 27, wherein the portions of said current blocking layer are formed of $Al_xGa_{1-x}As$, X is in a range between 0.0 and 0.7.

32. The semiconductor laser device of claim 27, wherein said carrier block layers are formed of $Al_xGa_{1-x}As$, wherein X is in a range between 0.0 and 0.7.

33. The semiconductor laser device of claim 27, wherein said wave guide layers are formed of GaAs.

34. The semiconductor laser device of claim 25, wherein a normalized frequency $V_e$ is defined as $$V_e = (\pi \cdot d_e/\lambda) \cdot (N_0^2 - N_3^2)^{0.5},$$

wherein $\pi$ is the circumference ratio, $N_0$ is a maximum value of refractive index of said first and second wave guide layers, $N_3$ is a refractive index of said clad layer on the current blocking layer side, $d_e$ is an effective thickness between said clad layers, and $\lambda$ is an oscillation wavelength of a semiconductor laser, $$V_e > \pi/3.$$

35. The semiconductor laser device of claim 25, wherein, $$V_1 = (\pi \cdot d_2/\lambda) \cdot (N_0^2 - N_3^2)^{0.5}$$

and $$V_2 = (\pi \cdot d_3/\lambda) \cdot (N_0^2 - N_3^2)^{0.5}$$

wherein $\pi$ is the circumference ratio, $N_0$ is maximum value of a refractive index of the first and the second wave guide layers, $N_2$ and $d_2$ are a refractive index and a thickness of one of said carrier block layers, respectively, $N_3$ is a refractive index of said clad layer on the current blocking layer side, and $d_3$ is a thickness of an active region sandwiched between the first and the second clad layers, $$V_1 < V_2/10.$$

36. The semiconductor laser device of claim 34, wherein the portions of said current blocking layer are formed of $Al_xGa_{1-x}As$, X is in a range between 0.0 and 0.7.

37. The semiconductor laser device of claim 34, wherein said carrier block layers are formed of $Al_xGa_{1-x}As$, wherein X is in a range between 0.0 and 0.7.

38. The semiconductor laser device of claim 34, wherein said wave guide layers are formed of GaAs.

39. The semiconductor laser device of claim 35, wherein the portions of said current blocking layer are formed of $Al_xGa_{1-x}As$, X is in a range between 0.0 and 0.7.

40. The semiconductor laser device of claim 35, wherein said carrier block layers are formed of $Al_xGa_{1-x}As$, wherein X is in a range between 0.0 and 0.7.

41. The semiconductor laser device of claim 35, wherein said wave guide layers are formed of GaAs.

* * * * *

UNITED STATES PATENT AND TRADEMARK OFFICE
CERTIFICATE OF CORRECTION

PATENT NO. : 6,118,799                                           Page 1 of 1
DATED : September 12, 2000
INVENTOR(S) : Atsushi Okubo et al.

It is certified that error appears in the above-identified patent and that said Letters Patent is hereby corrected as shown below:

Category [86],
Please change the § 371 Date from "Jun. 10, 1997" to -- April 18, 1997 --.

Signed and Sealed this

Twenty-fifth Day of September, 2001

Attest:

*Attesting Officer*

NICHOLAS P. GODICI
*Acting Director of the United States Patent and Trademark Office*